(12) United States Patent
Zhao

(10) Patent No.: US 6,259,388 B1
(45) Date of Patent: Jul. 10, 2001

(54) MULTIPLICATION-FREE ARITHMETIC CODING

(75) Inventor: Fengguang Zhao, Shanghai (CN)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/240,576

(22) Filed: Feb. 1, 1999

(30) Foreign Application Priority Data

Sep. 30, 1998 (CN) .................................................. 98124330

(51) Int. Cl.[7] .................................................. H03M 7/30
(52) U.S. Cl. ................................................................ 341/107
(58) Field of Search ............................................... 341/107

(56) References Cited

U.S. PATENT DOCUMENTS

| | | |
|---|---|---|
| 4,369,463 | 1/1983 | Anastassiou et al. . |
| 4,467,317 | 8/1984 | Langdon, Jr. et al. . |
| 4,633,490 | 12/1986 | Goertzel et al. . |
| 4,652,856 | 3/1987 | Mohiuddin et al. . |
| 4,665,436 | 5/1987 | Osborne et al. . |
| 4,725,884 | 2/1988 | Gurnell et al. . |
| 4,749,983 | 6/1988 | Langdon, Jr. . |
| 4,905,297 | 2/1990 | Langdon, Jr. et al. . |
| 4,935,882 | 6/1990 | Pennebaker et al. . |
| 4,973,961 | 11/1990 | Chamzas et al. . |
| 4,989,000 | * 1/1991 | Chevion et al. ..................... 341/107 |
| 5,025,258 | 6/1991 | Duttweiler . |
| 5,099,440 | 3/1992 | Pennebaker et al. . |
| 5,418,532 | * 5/1995 | Lei ....................................... 341/107 |

FOREIGN PATENT DOCUMENTS

| | | |
|---|---|---|
| 246275 | 2/1990 | (JP) . |
| 3247123 | 11/1991 | (JP) . |

* cited by examiner

*Primary Examiner*—Howard L. Williams

(57) ABSTRACT

A multiplication-free arithmetic coding technique for performing encoding and decoding. The encoding technique includes receiving a symbol from encoded stream and two frequency counts, finding a most probable symbol and a least probable symbol, subjecting a first register to magnitude shift operations for outputting bits to the encoded bit stream and for approximating a contextual probability of each symbol in the encoded string, an encoding a next symbol in the encoded string based on the contextual probability. The multiplication-free arithmetic coding eliminates the need for a magnitude step and the need for conventional carry over techniques, such as bit stuffing, and therefore provides a low computationally complex and low cost hardware implementation, while still achieving compression ratios comparable to those obtained by multiplication-base techniques.

29 Claims, 3 Drawing Sheets

MULTIPLICATION-FREE ARITHMETIC CODING

BACKGROUND OF THE INVENTION

1. Field of the Invention

The present invention relates to an arithmetic coding technique, and more particularly, to an arithmetic coding technique with low computational complexity and a low cost hardware implementation.

2. Description of the Related Art

The compression of data into fewer bits is often utilized in order to achieve a desired rate of data of transfer or to store data in a limited memory space. Some time after the data is compressed, the original data is to be retrieved by decompressing the originally compressed data.

Arithmetic coding is one technique for achieving data compression and decompression. In arithmetic coding, one decision after another is encoded to define successively smaller, lesser-included intervals along a number line. Arithmetic coding provides that each decision has a plurality of possible exclusive outcomes or events. Each outcome or event is represented by a symbol.

In accordance with prior art arithmetic coding teachings, a probability line has a current interval defined therealong. The first current interval is 0 to 1. The current interval is divided into segments in which each segment corresponds to one possible outcome for the next decision. Where there are only two possible outcomes for each decision, the current interval is divided into two segments. The length of each segment is based on its respective associated probability. The respective probabilities may remain fixed or may adapt as decision data is entered.

The power of arithmetic codes resides in the compression they achieve and the flexibility of arithmetic codes resides in their ability to encode strings modeled by stationary or non-stationary sources with equal ease. Arithmetic codes permit encoding of binary strings without the need for alphabetic extension, and also encode strings with symbols drawn from alphabets containing more than two characters.

An arithmetic code updates the probability P(s) of a so-far processed source string s, by the multiplication $P(s)*P(i/s)$ where $P(i/s)$ is a conditional probability of the symbol i given s. The multiplication required for augmenting the probability is relatively expensive and slow, even in the case where the probabilities are represented by binary numbers having at most a fixed number of significant digits.

U.S. Pat. No. 4,467,317 implements a recursive technique which simplifies the encoding operation of a binary symbol stream by approximating the probability of a less probable signal (LPS) with an integral power of one-half. However, this technique is not easily generalized to non-binary alphabets because n-ary alphabet symbol probabilities cannot be accurately approximated as powers of one-half. This limitation is significant in view of the growing parallelism in data structures and operations in present day processors. Further, the recursive technique depends upon the existence of a sophisticated modeling unit capable of calculating and providing source statistical characteristics. Implicit in the calculation of source statistical characteristics is a default of a skew number calculation operation to the modeling unit, an operation which adds to the complexity of the overall data compression problem.

U.S. Pat. No. 4,652,856 discloses an arithmetic coding technique which is capable of coding a multi-character alphabet, without multiplication or division in order to generate a binary code stream in response to simplified data source statistical characteristics that preserve the very desirable property of concurrent updating of the both the code stream and an internal coding variable. The 4,652,856 Patent is based upon an encoding algorithm that accepts symbol occurrence counts in binary form, subjects those counts to simple magnitude shift operations to approximate the contextual probability of each symbol of the symbol stream, augments the coded stream, and then simultaneously locates the w least significant bits of the code stream and adjusts the value of an internal coding variable determinant of the next coding sub-interval in response to one of the shifted occurrence counts.

Arithmetic coding is a statistical compression method and thus must work with a model that estimates the probability of each possible symbol in the modeled source. The model can be fixed, semi-fixed or adaptive. A fixed model has a probability distribution $P_1, P_2, \ldots, p_n$, where $1, 2, \ldots, n$ are the symbols in the modeled source.

Arithmetic coding works based upon a interval transformation, which transforms one interval $[l_k, h_k)$ into another interval $[l_k+_1, h_k+1)$, provided that a symbol i is encoded, where $$l_{k+1} = l_k + r_k \sum_{j=0}^{i-1} P_j \quad (1)$$

$$h_{k+1} = l_k + r_k \sum_{j=0}^{i} P_j \quad (2)$$

$$r_{k+1} = h_{k+1} - l_{k+1} \quad (3)$$

$r_k$ denotes the range of the interval $[l_k, h_k)$. Initially, the encoder starts with the unit interval $[0,1)$. This implies $l_0=0$, $h_0=1$, $r_0=1$.

Arithmetic encoding cannot be implemented on a finite precision computer, since all operations involved in equations (1)–(3) are floating-point math. However, it turns out, arithmetic coding can be best accomplished using standard 16-bit and 32-bits integer operations, Floating-point math is neither required nor helpful. What is required is an incremental transmission scheme.

As a simple example consider the case for n=2, i.e., a binary source employing a 0-order Markov model to estimate the probabilities $p_0$ and $P_1$. In this example, equation (1), (2) and (3) can be simplified to $$r_{k+1}=r_k P_0, \text{ for } i=0 \quad (4)$$

$$l_{k+1}=l_k+r_k p_0, r_{k+1}=r_k P_1, \text{ for } i=1 \quad (5)$$

where i is the so far encoded symbol.

For a practical implementation of equation (4) and (5), $p_0$ and $p_1$ is replaced with frequency counts $c_0$ and $c_1$, which may be adaptively adjusted during the encoding process.

$$p_0=c_0/(c_0+c_1), p_1=c_1/(c_0+c_1) \quad (6)$$

In conventional designs for arithmetic coding, the encoder uses two registers of size 16 bits, L and R, to store the fraction value of $l_k$ and $r_k$ respectively. Combining (4), (5) and (6) yields $$L:=L, R:=Rc_0/(c_0+c_1), i=0 \quad (7)$$

$$L:=L+Rc_0/(c_0+c_1), R:=Rc_1/(c_0+c_1), i=1 \quad (8)$$

where m-bits integer operations are involved, and m-bits integer rounding is used (where m is a typical hardware register size, such as 8, 16, or 32). Most algorithms now available are based upon equation (7) and (8) or their variations. Note that equations (7) and (8) include integer multiplications and divisions and therefore, are not suitable for hardware design, such as digital signal processor (DSP) and Smart card implementations, where no division instruction is available.

SUMMARY OF THE INVENTION

The present inventions provides an arithmetic coding implementation for bit-level arithmetic coding. The present invention performs arithmetic coding without multiplications and divisions. In particular, the encoding and decoding performed in the present invention receives frequency counts, namely, a frequency count representing a fractional value of the probability of 0, a frequency count representing the fractional value of the probability of 1, and the so-far encoded symbol, in order to encode/decode subsequent symbols.

The present invention also eliminates the need for conventional carry over techniques, such as bit stuffing. In the present invention, a magnitude determination is not necessary and the value of the register is adjusted before encoding a bit, whereas in conventional designs which require a magnitude determination, the bit is encoded before adjusting the value of the register.

In the present invention, the initial values of the two registers are set to 1 and random, in contrast to $2^{m-1}$ or $2^{m-1}$ and 0. As a result, the first word in the output stream can be used to denote synchronous words for a real time transmission application.

The present invention also provides a low computationally complex and low cost hardware implementation, while still achieving compression ratios comparable to those obtained by multiplication-based techniques.

DETAILED DESCRIPTION OF THE PREFERRED EMBODIMENT

Figure 1A:
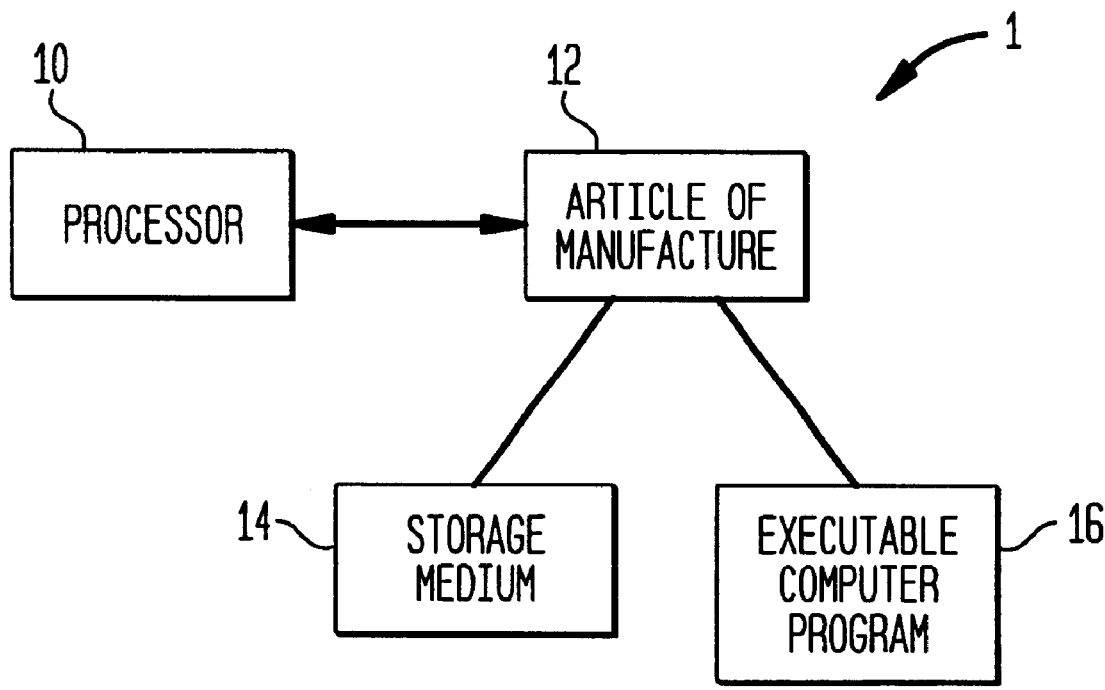
FIGS. 1(a) and 1(b) illustrate block diagrams of the present invention in one embodiment.
Figure 1B:
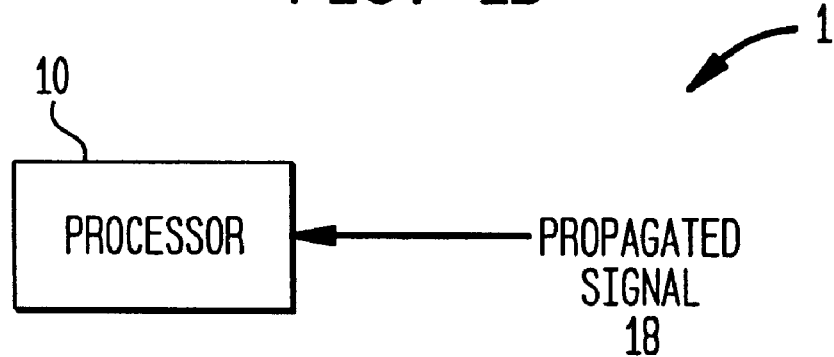

The present invention will be described more fully with reference to FIGS. 1–3. FIG. 1(a) illustrates a hardware diagram in one embodiment of the present invention. The multiplication-free arithmetic encoding is performed by a system 1, illustrated in FIG. 1(a). The system 1 includes at least a processor 10 and an article of manufacture 12. The article of manufacture 12 further includes a storage medium 14 and an executable computer program 16. The executable computer program 16 includes the instructions to perform the multiplication-free arithmetic coding. In another embodiment, as illustrated in FIG. 1(b), the computer executable program 16 is provided as part of an externally supplied propagated signal 18.

Encoding

First, the encoding operation will be described. Initially, two registers R and L, are set to 1 and an arbitrary number, respectively. The processor 10 is supplied with three inputs, a first frequency count $c_0$ representing a fractional value of the probability of 0, a second frequency count $c_1$, representing a fractional value of the probability 1, and a so-far encoded symbol i (either 0 or 1).

The encoding steps performed by the processor 10 can be summarized in pseudocode as:

1. If $c_0 > c_1$, exchange the values of $c_0$ and $c_1$, and let i=!i.
2. While $R \leq c_1$, do
    Output the most significant bit of L.
    L=L<<=1, R=R<<=1.
    If R>~L, then R=~L+1.
3. If i=0, then R=$c_0$; else R=R–$c_0$, L=L+$c_0$.

Output L

Note that some C Language notation is employed in the above pseudocode. ! represents logic complement, ~ represents binary complement, and <<= represents arithmetic shift left. From the description above, the present invention operates on the following assumption: for each iteration, R~$c_0$+$c_1$; therefore equation (7) and (8) are reduced to $$L:=L, R:=c_0, i=0 \tag{9}$$

$$L:=L+c_0, R:=R-c_0, i=1 \tag{10}$$

In the present invention, initializing the two registers R and L to 1 and an arbitrary number, respectively, permits the first word in the output stream to denote a synchronous word for real time transmission applications. Further, step 1 is generally referred to as an exchange step, step 2 is referred to as an adjustment step, and step 3 is referred to as an encoding step. A magnitude step, which is required in conventional multiplication-free arithmetic coding techniques is not required in the present invention. In the present invention, the adjustment step is executed before the encoding step. In the adjustment step, executing the "while" loop when the value of register R is less than or equal to the value of the second frequency count and setting the value of register R equal to the binary complement of the value of register L plus one if the value of the register R is greater than the binary complement of the value of register R eliminates the need for a subsequent bit stuffing step.

To summarize, the method of multiplication-free arithmetic coding of the present invention produces an encoded bit stream by receiving a symbol from an encoded string and two frequency counts, finding a most probable symbol and a least probable symbol; subjecting a first register to magnitude shift operations for outputting bits to the encoded bit stream and for approximating a contextual probability of each symbol in the encoded string, and encoding a next symbol in the encoded string based on the contextual probability.

Figure 2:
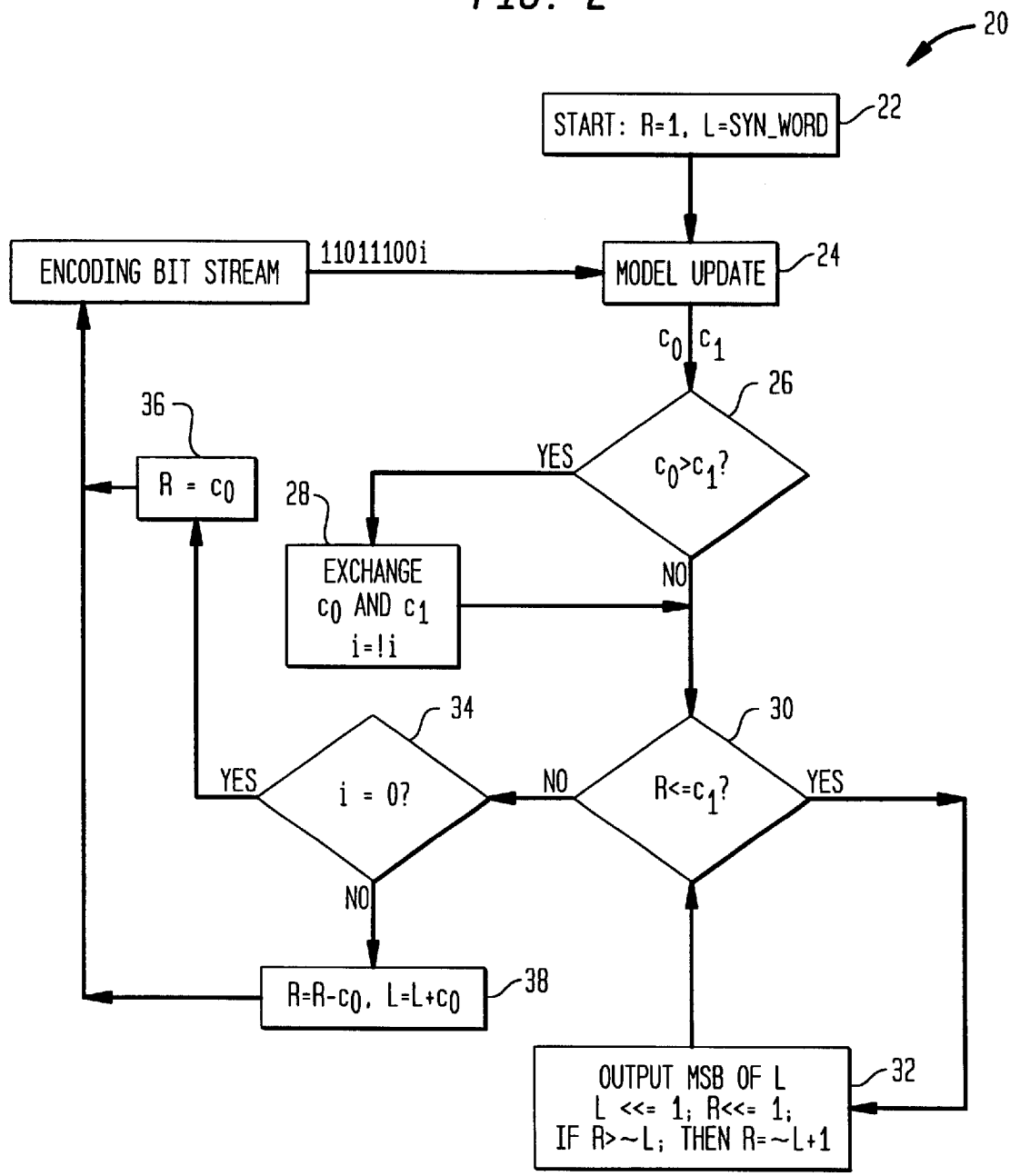
FIG. 2 illustrates a flowchart for encoding in one embodiment of the present invention.

FIG. 2 includes the specific steps performed by the processor 10 in the encoding process 20 in more detail. In particular, in step 22, registers R and L are initialized to 1 and the sync word, respectively. The encoded bit stream, in this example, 11011100i, is input along with the initial values of registers R and L to the 0-order Markov model at step 24 to produce the frequency counts $c_0$ and $c_1$. In step 26, $c_0$ and $c_1$ are compared and if $c_0$ is greater than $c_1$, $c_0$ and $c_1$ are exchanged and i is set to its logical complement at step 28. If however, $c_0$ is not greater than $c_1$, processing proceeds to step 30, where it is determined whether the value in register R is greater than or equal to $c_1$. If so, processing proceeds to step 32, where the most significant bit of the L register is output, L and R are arithmetically left shifted, and if R is greater than the binary complement of L, then R is set to the binary complement of L plus one, and processing returns to step 30. If the value of register R is not greater than equal to $C_1$, then processing continues to step 34. In step 34 it is determined whether i is equal to 0. If i is equal to 0, then the value of register R is set equal to $C_0$ at step 36 and if i is not equal to 0 then R is set to the previous value of R minus $c_0$ and L is set to the previous value of L plus $c_0$ in step 38, thereby encoding the next bit in the bit stream. The process then repeats by inputting the next bit to the Markov model update at step 24. The processing is continued until all bits of the input bit stream are encoded. Then, the value of register L is output as the encoded bit stream.

Although the present invention is described utilizing a 0-order Markov model, any model, known to one ordinary skill in the art, could be utilized.

Decoding

For decoding the R and L registers are again initialized and a third register V is utilized to store part of the decoding bit stream, and i denotes the output bit. If S is the decoding bit stream, which is generated by the encoding algorithm described above, the decoding steps performed by the processor 10 are summarized in pseudocode as:

1. If $c_0 > c_1$, exchange the values of $c_0$ and $c_1$, and let i=1; else i=0.
2. While $R \leq c_1$, do
   L=L<<1, R=R<<1, V=V<<1.
   V=v| next bit from S.
   If R>~L, then R=~L+1.
3. If $c_0 < V$, then R=$c_0$; else R=R−$c_0$, L=L+$c_0$, and i=!i To summarize, the method of the multiplication-free arithmetic coding to produce a decoded string receives bits from a decoded stream and two frequency counts, finds a most probable symbol and a least probable symbol, subjecting a first register to magnitude shift operations for inputting bits from the decoded bit stream and for approximating a contextual probability of each symbol in the decoded string, and decoding a next symbol to the decoded stream based on the contextual probability.

Figure 3:
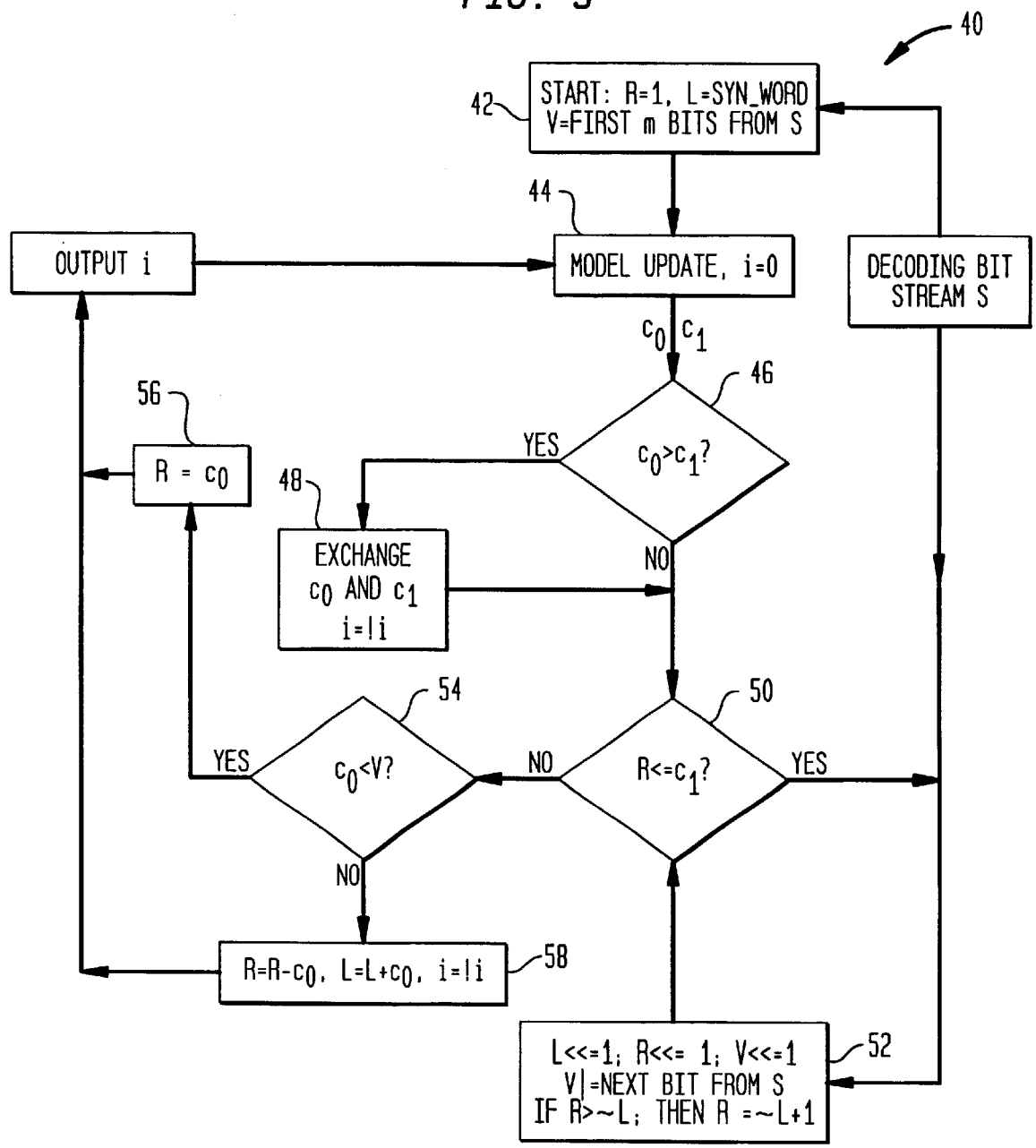
FIG. 3 illustrates a flowchart for decoding in one embodiment of the present invention.

FIG. 3 includes the specific steps performed by the processor 10 in the decoding process 40 in more detail. In particular, in step 42, the register R, L, and V are initialized. The values of registers R, L, and V and the string to be decoded are input to 0-Markov model at step 44 to produce frequency counts $c_0$ and $c_1$. In step 46, $c_0$ and $c_1$ are compared and if $c_0$ is greater than $c_1$, $c_0$ and $c_1$ are exchanged and i is set to its logical complement at step 48. If however, $c_0$ is not greater than $c_1$, processing proceeds to step 50, where it is determined whether the value of register R is greater than or equal to $c_1$. If so, processing proceeds to step 52 where registers R, L, and V are all arithmetically left shifted, the next bit from the decoding bit stream S is added to register V, and if R is greater than the binary complement of L, then R is set to the binary complement of L plus one. Processing then returns to step 50.

If the value of register R is not greater than or equal to $c_1$, then processing continues to step 54. In step 54, it is determined whether $c_0$ is less than V. If $c_0$ is less than V, then the value of register R is set equal to $c_0$ at step 56 and if $c_0$ is not less than V, then R is set to the previous value of R minus $c_0$, L is set to the previous value of L plus $c_0$, and i is set to its logic complement at step 58, thereby decoding the next bit in the bit stream S. The process then repeats by inputting the next bit to the Markov model update at step 44. The processing is continued until all bits of the decoding bit stream S are decoded.

Again, although the present invention just described utilizing a 0-order Markov model, any model, known to one of ordinary skill in the art, could be utilized.

Table 1, set forth below, illustrates a compression ratio comparison for files of varying types, between an encoder which implements multiplication, the prior art technique disclosed in U.S. Pat. No. 4,652,856, and the multiplication-free arithmetic coding of the present invention.

As illustrated in Table 1, the present invention achieves a compression ratio better than prior art multiplication-free arithmetic techniques. Table 1 also illustrates that the multiplication encoder usually provides the best compression because each multiplication-free design utilizes some approximate value instead of practical probabilities, so there will usually some degradation in compression ratios utilizing multiplication-free arithmetic techniques. However, the present invention, as illustrated in Table 1, provides a low computationally complex and low cost hardware implementation, which still achieves compression ratios which are comparable to multiplication-base techniques.

What is claimed is:

1. A method of multiplication-free arithmetic coding to produce an encoded bit stream, comprising the steps of:

initializing a first register to one and allowing a second register to be an arbitrary number;

for each symbol in an input string, iteratively performing the following steps a–e:

a. receiving a first frequency count representing a fractional value of the probability of 0, a second frequency count representing a fractional value of the probability of 1, and the symbol;

b. if the first frequency count is greater than the second frequency count, then exchanging the values of the first frequency count and the second frequency count and setting a value of the encoded symbol to its logic complement;

c. while a value of the first register is less than or equal to the first frequency count, iteratively performing the following steps c1–c3:

c1. outputting a most significant bit of the second register, c2. left-shifting a value of the first register and a value of the second register, and c3. if the value of the first register is greater than the binary complement of the value of the second register, then setting the value of the first register to the binary complement of the value of the second register plus one;

d. if the symbol equals zero, setting a value of the first register to the first frequency count, else subtracting the first frequency count from the value of the first register and adding the first frequency count to the value of the second register; and e. selecting the next symbol in the input string; and outputting the value of the second register as the encoded bit stream.

2. A processor for performing multiplication-free arithmetic coding to produce an encoded bit stream, comprising:

an initialization processing unit for initializing a first register to one and allowing a second register to be an arbitrary number;

a processing unit for performing the following operations, for each symbol in an input string, iteratively performing the following operations a–e:

a. receiving a first frequency count representing a fractional value of the probability of 0, a second frequency count representing a fractional value of the probability of 1, and the symbol;

b. if the first frequency count is greater than the second frequency count, then exchanging the values of the first frequency count and the second frequency count and setting a value of the symbol to its logic complement;

c. while a value of the first register is less than or equal to the first frequency count, iteratively performing the following steps c1–c3:

c1. outputting a most significant bit of the second register, c2. left-shifting a value of the first register and a value of the second register, and c3. if the value of the first register is greater than the binary complement of the value of the second register, then setting the value of the first register to the binary complement of the value of the second register plus one;

d. if the symbol equals zero, setting a value of the first register to the first frequency count, else subtracting the first frequency count from the value of the first register and adding the first frequency count to the value of the second register; and e. selecting the next symbol in the input string; and an output processing unit for outputting the value of the second register as the encoded bit stream.

3. A computer program embodied on a computer-readable medium for performing multiplication-free arithmetic coding to produce an encoded bit stream, comprising:

an initialization source code segment for initializing a first register to one and allowing a second register to be an arbitrary number;

a processing source code segment for performing the following operations, for each symbol in an input string, iteratively performing the following operations a–e:

a. receiving a first frequency count representing a fractional value of the probability of 0, a second frequency count representing a fractional value of the probability of 1, and the symbol;

b. if the first frequency count is greater than the second frequency count, then exchanging the values of the first frequency count and the second frequency count and setting a value of the symbol to its logic complement;

c. while a value of the first register is less than or equal to the first frequency count, iteratively performing the following steps c1–c3:

c1. outputting a most significant bit of the second register, c2. left-shifting a value of the first register and a value of the second register, and c3. if the value of the first register is greater than the binary complement of the value of the second register, then setting the value of the first register to the binary complement of the value of the second register plus one;

d. if the symbol equals zero, setting a value of the first register to the first frequency count, else subtracting the first frequency count from the value of the first register and adding the first frequency count to the value of the second register; and e. selecting the next symbol in the input string; and an output source code segment for outputting the value of the second register as the encoded bit stream.

4. A computer signal for performing multiplication-free arithmetic coding to produce an encoded bit stream, comprising:

an initialization signal segment for initializing a first register to one and allowing a second register to be an arbitrary number;

a processing signal segment for performing the following operations, for each symbol in an input string, iteratively performing the following operations a–e:

a. receiving a first frequency count representing a fractional value of the probability of 0, a second frequency count representing a fractional value of the probability of 1, and the symbol;

b. if the first frequency count is greater than the second frequency count, then exchanging the values of the first frequency count and the second frequency count and setting a value of the symbol to its logic complement;

c. while a value of the first register is less than or equal to the first frequency count, iteratively performing the following steps c1–c3:

c1. outputting a most significant bit of the second register, c2. left-shifting a value of the first register and a value of the second register, and c3. if the value of the first register is greater than the binary complement of the value of the second register, then setting the value of the first register to the binary complement of the value of the second register plus one;

d. if the symbol equals zero, setting a value of the first register to the first frequency count, else subtracting the first frequency count from the value of the first register and adding the first frequency count to the value of the second register; and e. selecting the next symbol in the input string; and an output signal segment for outputting the value of the second register as the encoded bit stream.

5. The computer signal of claim 4, wherein said computer signal is embodied in a carrier wave.

6. A method of multiplication-free arithmetic coding to produce an encoded bit stream, comprising the steps of:

receiving a symbol from an encoded string and two frequency counts;

finding a most probable symbol and a least probable symbol;

subjecting a first register to magnitude shift operations for outputting bits to the encoded bit stream and for approximating a contextual probability of each symbol in the encoded string; and encoding a next symbol in the encoded string based on the contextual probability.

7. A method of multiplication-free arithmetic coding to produce an encoded bit stream, comprising the steps of:

receiving a symbol from an encoded string and two frequency counts;

finding a most probable symbol and a least probable symbol;

subjecting a first register to magnitude shift operations for outputting bits to the encoded bit stream and for approximating a contextual probability of each symbol in the encoded string; and encoding a next symbol in the encoded string based on the contextual probability;

wherein no magnitude or bit stuffing step is required.

8. A method of multiplication-free arithmetic coding to produce an encoded bit stream, comprising the steps of:

receiving a symbol from an encoded string and two frequency counts;

finding a most probable symbol and a least probable symbol;

subjecting a first register to magnitude shift operations for outputting bits to the encoded bit stream and for approximating a contextual probability of each symbol in the encoded string; and encoding a next symbol in the encoded string based on the contextual probability;

wherein said encoding step is performed after said subjecting step.

9. A processor for performing multiplication-free arithmetic coding to produce an encoded bit stream, comprising:

a receiving unit for receiving a symbol from an encoded string and two frequency counts; and a processing unit for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability.

10. A processor for performing multiplication-free arithmetic coding to produce an encoded bit stream, comprising:

a receiving unit for receiving a symbol from an encoded string and two frequency counts; and a processing unit for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein no magnitude or bit stuffing operation is required.

11. A processor for performing multiplication-free arithmetic coding to produce an encoded bit stream, comprising:

a receiving unit for receiving a symbol from an encoded string and two frequency counts; and a processing unit for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein said encoding step is performs the encoding after the magnitude shift operations.

12. A computer program embodied in a computer-readable medium for performing coding to produce an encoded bit stream, comprising:

a receiving source code segment for receiving a symbol from an encoded string and two frequency counts; and a processing source code segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability.

13. A computer program embodied in a computer-readable medium for performing coding to produce an encoded bit stream, comprising:

a receiving unit for receiving a symbol from an encoded string and two frequency counts; and a processing source code segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein no magnitude or bit stuffing operation is required.

14. A computer program embodied in a computer-readable medium for performing coding to produce an encoded bit stream, comprising:

a receiving source code segment for receiving a symbol from an encoded string and two frequency counts; and a processing source code segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein said processing source code segment performs the encoding after the magnitude shift operations.

15. A computer signal for performing multiplication-free arithmetic coding to produce an encoded bit stream, comprising:

a receiving signal segment for receiving a symbol from an encoded string and two frequency counts; and a processing signal segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability.

16. A computer signal for performing a multiplication-free arithmetic coding to produce an encoded bit stream, comprising:

a receiving signal segment for receiving a symbol from an encoded string and two frequency counts; and a processing signal segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein no magnitude or bit stuffing signal segment is required.

17. The computer signal of claim 16, wherein said computer signal is embodied in a carrier wave.

18. A computer signal for performing a multiplication-free arithmetic coding to produce an encoded bit stream, comprising:

a receiving signal segment for receiving a symbol from an encoded string and two frequency counts; and a processing signal segment for finding a most probable symbol and a least probable symbol, subjecting a first register to magnitude shift operations for outputting bits to the encoded bit stream and for approximating a contextual probability of each symbol in the encoded string, and encoding a next symbol in the encoded string based on the contextual probability;

wherein said processing signal segment performing the encoding after the magnitude shift operations.

19. The computer signal of claim 18, wherein said computer signal is embodied in a carrier wave.

20. A method of multiplication-free arithmetic coding to produce a decoded string, comprising the steps of:

initializing a first register to one and allowing a second register to be an arbitrary number;

receiving a first frequency count representing a fractional value of the probability of 0, a second frequency count representing a fractional value of the probability of 1, and an output bit;

if the first frequency count is greater than the second frequency count, then exchanging the values of the first frequency count and the second frequency count and setting a value of the output bit to one, else setting value of the output bit to zero;

while a value of the first register is less than or equal to the first frequency count, iteratively performing the following steps a–c:
  a. left-shifting a value of the first register, a value of the second register, and a value of a third register which includes the decoded string,
  b. supplying a next bit from a bit stream to the third register, and
  c. if the value of the first register is greater than the binary complement of the value of the second register, then setting the value of the first register to the binary complement of the value of the second register plus one; and if the first frequency count is less than the value of the third register, setting a value of the first register to the first frequency count and outputting the output bit as the next bit of the decoded string, else subtracting the first frequency count from the value of the first register and adding the first frequency count to the value of the second register and outputting the logic complement of the output bit as the next bit of the decoded string.

21. A processor for performing multiplication-free arithmetic coding to produce a decoded string, comprising:

an initialization processing unit for initializing a first register to one and allowing a second register to be an arbitrary number;

an input processing unit for receiving a first frequency count representing a fractional value of the probability of 0, a second frequency count representing a fractional value of the probability of 1, and an output bit; and a processing unit for performing the following operations,
  if the first frequency count is greater than the second frequency count, then exchanging the values of the first frequency count and the second frequency count and setting a value of the output bit to one, else setting value of the output bit to zero;
  while a value of the first register is less than or equal to the first frequency count, iteratively performing the following steps a–c:
    a. left-shifting a value of the first register, a value of the second register, and a value of a third register which includes the decoded string,
    b. supplying a next bit from a bit stream to the third register, and
    c. if the value of the first register is greater than the binary complement of the value of the second register, then setting the value of the first register to the binary complement of the value of the second register plus one;
  if the first frequency count is less than the value of the third register, setting a value of the first register to the first frequency count and outputting the output bit as the next bit of the decoded string, else subtracting the first frequency count from the value of the first register and adding the first frequency count to the value of the second register and outputting the logic complement of the output bit as the next bit of the decoded string.

22. A computer program embodied in a computer-readable medium for performing multiplication-free arithmetic coding to produce a decoded string, comprising:

an initialization source code segment for initializing a first register to one and allowing a second register to be an arbitrary number;

an input source code segment for receiving a first frequency count representing a fractional value of the probability of 0, a second frequency count representing a fractional value of the probability of 1, and an output bit; and a processing source code segment for performing the following operations,
  if the first frequency count is greater than the second frequency count, then exchanging the values of the first frequency count and the second frequency count and setting a value of the output bit to one, else setting value of the output bit to zero;
  while a value of the first register is less than or equal to the first frequency count, iteratively performing the following steps a–c:
    a. left-shifting a value of the first register, a value of the second register, and a value of a third register which includes the decoded string,
    b. supplying a next bit from a bit stream to the third register, and
    c. if the value of the first register is greater than the binary complement of the value of the second register, then setting the value of the first register to the binary complement of the value of the second register plus one; and
  if the first frequency count is less than the value of the third register, setting a value of the first register to the first frequency count and outputting the output bit as the next bit of the decoded string, else subtracting the first frequency count from the value of the first register and adding the first frequency count to the value of the second register and outputting the logic complement of the output bit as the next bit of the decoded string.

23. A computer signal for performing multiplication-free arithmetic coding to produce a decoded string, comprising:

an initialization signal segment for initializing a first register to one and allowing a second register to be an arbitrary number;

a receiving signal segment for receiving a first frequency count representing a fractional value of the probability of 0, a second frequency count representing a fractional value of the probability of 1, and an output bit; and a processing signal segment for performing the following operations,
  if the first frequency count is greater than the second frequency count, then exchanging the values of the first frequency count and the second frequency count and setting a value of the output bit to one, else setting value of the output bit to zero;
  while a value of the first register is less than or equal to the first frequency count, iteratively performing the following steps a–c:
    a. left-shifting a value of the first register, a value of the second register, and a value of a third register which includes the decoded string, b. supplying a next bit from a bit stream to the third register, and c. if the value of the first register is greater than the binary complement of the value of the second register, then setting the value of the first register to the binary complement of the value of the second register plus one; and if the first frequency count is less than the value of the third register, setting a value of the first register to the first frequency count and outputting the output bit as the next bit of the decoded string, else subtracting the first frequency count from the value of the first register and adding the first frequency count to the value of the second register and outputting the logic complement of the output bit as the next bit of the decoded string.

24. The computer signal of claim 23, wherein said computer signal is embodied in a carrier wave.

25. A method of multiplication-free arithmetic coding to produce a decoded string, comprising the steps of:

receiving bits from a decoded bit stream and two frequency counts;

finding a most probable symbol and a least probable symbol;

subjecting a first register to magnitude shift operations for inputting bits from the decoded bit stream and for approximating a contextual probability of each symbol in the decoded string; and decoding a next symbol to the decoded string based on the contextual probability.

26. A processor for performing multiplication-free arithmetic coding to produce a decoded string, comprising:

a receiving unit for receiving bits from a decoded bit stream and two frequency counts; and a processing unit for finding a most probable symbol and a least probable symbol, subjecting a first register to magnitude shift operations for inputting bits from the decoded bit stream and for approximating a contextual probability of each symbol in the decoded string and decoding a next symbol to the decoded string based on the contextual probability.

27. A computer program embodied on a computer-readable medium for performing multiplication-free arithmetic coding to produce a decoded string, comprising:

a receiving source code segment for receiving bits from a decoded bit stream and two frequency counts; and a processing source code segment for finding a most probable symbol and a least probable symbol subjecting a first register to magnitude shift operations for inputting bits from the decoded bit stream and for approximating a contextual probability of each symbol in the decoded string and decoding a next symbol to the decoded string based on the contextual probability.

28. A computer signal for performing multiplication-free arithmetic coding to produce a decoded string, comprising:

a receiving signal segment for receiving bits from a decoded bit stream and two frequency counts; and a processing signal segment for finding a most probable symbol and a least probable symbol, subjecting a first register to magnitude shift operations for inputting bits from the decoded bit stream and for approximating a contextual probability of each symbol in the decoded string, decoding a next symbol to the decoded string based on the contextual probability.

29. The computer signal of claim 28, wherein said computer signal is embodied in a carrier wave.

\* \* \* \* \*